United States Patent
Kris et al.

(10) Patent No.: US 8,866,525 B2
(45) Date of Patent: Oct. 21, 2014

(54) CONFIGURABLE TIME DELAYS FOR EQUALIZING PULSE WIDTH MODULATION TIMING

(71) Applicant: Microchip Technology Incorporated, Chandler, AZ (US)

(72) Inventors: Bryan Kris, Gilbert, AZ (US); John Day, Marlborough, MA (US); Alex Dumais, Gilbert, AZ (US); Stephen Bowling, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/778,436

(22) Filed: Feb. 27, 2013

(65) Prior Publication Data
US 2014/0240020 A1  Aug. 28, 2014

(51) Int. Cl.
*H03K 3/017* (2006.01)
*H03K 5/13* (2014.01)

(52) U.S. Cl.
CPC ..................... *H03K 5/132* (2013.01)
USPC ............ 327/172; 327/176; 327/293; 327/298

(58) Field of Classification Search
USPC .................. 327/172–176, 291, 293, 295, 298
See application file for complete search history.

(56) References Cited

U.S. PATENT DOCUMENTS

| | | | | |
|---|---|---|---|---|
| 6,885,229 | B2* | 4/2005 | Okuno et al. | 327/172 |
| 2003/0090307 | A1* | 5/2003 | Shin | 327/200 |
| 2005/0110475 | A1 | 5/2005 | Chapuis et al. | 323/282 |
| 2009/0160412 | A1 | 6/2009 | Latham et al. | 323/282 |

FOREIGN PATENT DOCUMENTS

| | | | |
|---|---|---|---|
| DE | 102008022923 A1 | 11/2009 | H02M 1/08 |
| DE | 102010063046 A1 | 6/2012 | H02M 1/38 |

OTHER PUBLICATIONS

International Search Report and Written Opinion, Application No. PCT/US2014/016189, 12 pages.

* cited by examiner

*Primary Examiner* — An Luu
(74) *Attorney, Agent, or Firm* — King & Spalding L.L.P.

(57) ABSTRACT

A plurality of PWM generators have user configurable time delay circuits for each PWM control signal generated therefrom. The time delay circuits are adjusted so that each of the PWM control signals arrive at their associated power transistors at the same time. This may be accomplished by determining a maximum delay time of the PWM control signal that has to traverse the longest propagation time and then setting the delay for that PWM control signal to substantially zero delay. Thereafter, all other delay time settings for the other PWM control signals may be determined by subtracting the propagation time for each of the other PWM control signals from the longest propagation time. Thereby insuring that all of the PWM control signals arrive at their respective power transistor control nodes with substantially the same time relationships as when they left their respective PWM generators.

15 Claims, 8 Drawing Sheets

CONFIGURABLE TIME DELAYS FOR EQUALIZING PULSE WIDTH MODULATION TIMING

TECHNICAL FIELD

The present disclosure relates to control of power conversion applications, and more particularly, to selecting delay times of pulse width modulation (PWM) signals to optimize control of power transistors in the power conversion applications.

BACKGROUND

In many power conversion applications, a plurality of power transistors are used to control the flow of power. These power transistors may be controlled by pulse width modulation (PWM) signals from PWM generators. The PWM signals may be isolated with pulse transformers, opto-couplers, digital isolators, etc., and then amplified with "gate drivers" for driving the power transistors. A problem exists in that different isolators, gate drivers and/or power transistors have different time delays in the PWM signal paths. These non-uniform PWM signal path delays cause the power transistors to turn on or off with non-ideal timing. Early turn-on or late turn-off may cause current shoot-through, and late turn-on may cause voltage spikes. In addition, PWM power conversion circuits are providing for faster power transistor switching to shrink size and cost of the power conversion applications, but PWM signal delays in the transistor gate drive circuitry remain constant, and thereby are becoming a larger portion of the PWM cycle. This results in increased power transistor stress that lowers reliability, and poor timing control that lowers power conversion efficiencies.

SUMMARY

Therefore, there is a need for a way to select delay times of pulse width modulation (PWM) signals so as to optimize control of power transistors in power conversion applications.

According to an embodiment, a method for equalizing time delays in a pulse width modulation (PWM) system may comprise the steps of: determining a maximum propagation delay of a one of a plurality of PWM signals; determining propagation delays of other ones of the plurality of PWM signals; subtracting each of the propagation delays of the other ones of the plurality of PWM signals from the maximum propagation delay; and adding a time delay to each of the other ones of the plurality of PWM signals that may be substantially equal to a difference between the maximum propagation delay and the propagation delay of the respective other one of the plurality of PWM signals.

According to a further embodiment of the method, an additional step may comprise the step of bypassing the time delays to the other ones of the plurality of PWM signals. According to a further embodiment of the method, an additional step may comprise the step of bypassing the time delays to the other ones of the plurality of PWM signals when a current limit condition occurs. According to a further embodiment of the method, an additional step may comprise the step of bypassing the time delays to the other ones of the plurality of PWM signals when a fault condition occurs. According to a further embodiment of the method, an additional step may comprise the step of changing time delays of the other ones of the plurality of PWM signals based upon external events.

According to another embodiment, a pulse width modulation (PWM) system may comprise: a plurality of pulse width modulation (PWM) generators for generating a plurality of PWM signals; and a plurality of configurable time delay circuits coupled between the plurality of PWM generators and associated switching power transistors; wherein a one of the plurality of PWM signals has a longest propagation delay to the associated switching power transistor and the associated configurable time delay circuit has substantially no time delay, and wherein the plurality of configurable time delay circuits associated with other ones of plurality of PWM signals have time delays sufficient in combination with associated time delays of the other ones of the plurality of PWM signals to substantially match the longest propagation delay.

According to further embodiment, each of the plurality of configurable time delay circuits may comprise: a plurality of shift registers coupled in cascade to provide for a plurality of time delays of the signal passing therethrough; and a first multiplexer having a plurality of inputs and an output, each one of the plurality of inputs may be coupled to an associated output of the plurality of shift registers; wherein a one of the plurality of inputs of the first multiplexer may be selected for the time delay desired. According to further embodiment, a delay control register may be coupled to the first multiplexer and may store a control value for selection of the one of the plurality of inputs of the first multiplexer.

According to further embodiment, a second multiplexer having a first input may be coupled to an output of the first multiplexer, a second input may be coupled to an associated PWM signal and a third input may be coupled to an alternate PWM signal; and logic circuits may be coupled to and may control the second multiplexer for selecting one of the inputs of the second multiplexer to be coupled to an output thereof.

According to further embodiment, an input control register may be coupled to the second multiplexer and may store a control value for selection of one of the inputs of the second multiplexer to be coupled to the output thereof. According to further embodiment, the plurality of shift registers and first multiplexer may be provided in a microcontroller.

According to further embodiment, each of the plurality of configurable time delay circuits may comprise: a positive edge detector having an input coupled to the PWM signal from the associated PWM generator; a negative edge detector having an input coupled to the PWM signal from the associated PWM generator; a logic high counter enable flip-flop having a set input coupled to an output of the positive edge detector; a logic low counter enable flip-flop having a set input coupled to an output of the negative edge detector; a logic high counter having a count enable input coupled to a Q-output of the logic high counter enable flip-flop; a logic low counter having a count enable input coupled to a Q-output of the logic low counter enable flip-flop; a delay register having a delay time value stored therein; a logic high comparator having first inputs coupled to outputs of the logic high counter and second inputs coupled to outputs of the delay register; a logic low comparator having first inputs coupled to outputs of the logic low counter and second inputs coupled to outputs of the delay register; and an output flip-flop having a set input coupled to an output from the logic high comparator, a clear input coupled to an output from the logic low comparator, and an output providing a delayed PWM signal; wherein when a count from the logic high counter may be equal to the delay time value the output from the logic high comparator sets a Q-output of the output flip-flop to a high logic level, and when a count from the logic low counter may be equal to the delay time value the output from the logic low comparator resets the Q-output of the output flip-flop to a low logic level. According to further embodiment, the edge detectors, counters, flip-flops, comparators and delay register may be provided in a microcontroller.

According to yet another embodiment, a time delay apparatus for delaying a pulse width modulation (PWM) signal may comprise: a plurality of shift registers coupled in cascade to provide for a plurality of time delays of a PWM signal passing therethrough; and a multiplexer having a plurality of inputs and an output, each one of the plurality of inputs may be coupled to an associated output of the plurality of shift registers; wherein a one of the plurality of inputs of the first multiplexer may be selected for a time delay desired and a time delayed PWM signal may be provided at the output of the first multiplexer. According to further embodiment, the plurality of shift registers and the multiplexer may be provided in a microcontroller.

According to still another embodiment, a time delay apparatus for delaying a pulse width modulation (PWM) signal may comprise: a positive edge detector having an input coupled to a PWM signal; a negative edge detector having an input coupled to the PWM signal; a logic high counter enable flip-flop having a set input coupled to an output of the positive edge detector; a logic low counter enable flip-flop having a set input coupled to an output of the negative edge detector; a logic high counter having a count enable input coupled to a Q-output of the logic high counter enable flip-flop; a logic low counter having a count enable input coupled to a Q-output of the logic low counter enable flip-flop; a delay register having a delay time value stored therein; a logic high comparator having first inputs coupled to outputs of the logic high counter and second inputs coupled to outputs of the delay register; a logic low comparator having first inputs coupled to outputs of the logic low counter and second inputs coupled to outputs of the delay register; and an output flip-flop having a set input coupled to an output from the logic high comparator, a clear input coupled to an output from the logic low comparator, and an output providing a delayed PWM signal; wherein when a count from the logic high counter may be equal to the delay time value the output from the logic high comparator sets a Q-output of the output flip-flop to a high logic level, and when a count from the logic low counter may be equal to the delay time value the output from the logic low comparator resets the Q-output of the output flip-flop to a low logic level. According to further embodiment, the positive and negative edge detectors, the logic high and logic low counter enable flip-flops, the logic high and logic low counters, the delay register, the logic high and logic low comparators, and the output flip-flop may be provided in a microcontroller.

BRIEF DESCRIPTION OF THE DRAWINGS

A more complete understanding of the present disclosure may be acquired by referring to the following description taken in conjunction with the accompanying drawings wherein.

Figure 1:
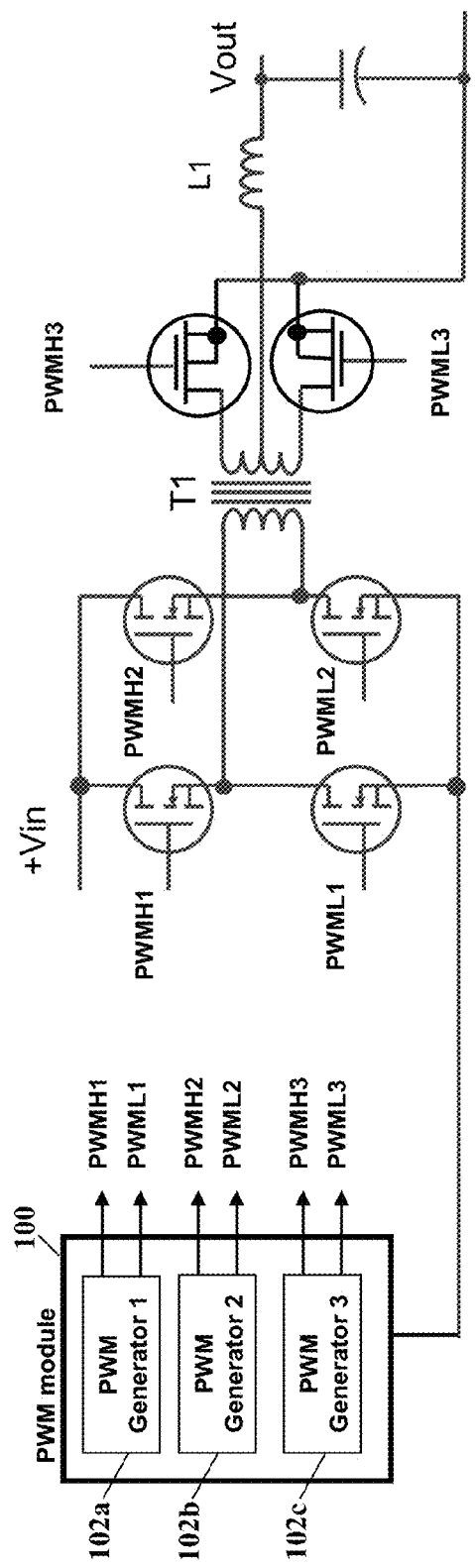
FIG. 1 illustrates a schematic block diagram of a pulse width modulation (PWM) generator having a plurality of complementary high and low PWM signals and a plurality of switching power transistors showing ideal control signal timing.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Configurable time delay circuits are provided for each PWM control signal from a plurality of PWM generators. The configurable time delay of each time delay circuit is user configurable for specific requirements of the associated power conversion application. The delay circuits are adjusted so that each of the PWM control signals arrive at their associated power transistors at the same time. This may be accomplished by determining a maximum delay time of the PWM control signal that has to traverse the longest propagation time and setting the delay for that PWM control signal to substantially zero delay. Thereafter, all other delay time settings for the other PWM control signals may be determined by subtracting the propagation time for each of the other PWM control signals from the longest propagation time. Thereby insuring that all of the PWM control signals arrive at their respective power transistor control nodes with substantially the same time relationships as when they left their respective PWM generators.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of a pulse width modulation (PWM) generator having a plurality of complementary high and low PWM signals and a plurality of switching power transistors showing ideal control signal timing. In an ideal circuit layout all of the PWM control signals from the PWM generators 102 would reach the gates of their respective power transistors at substantially the same time.

Figure 2:
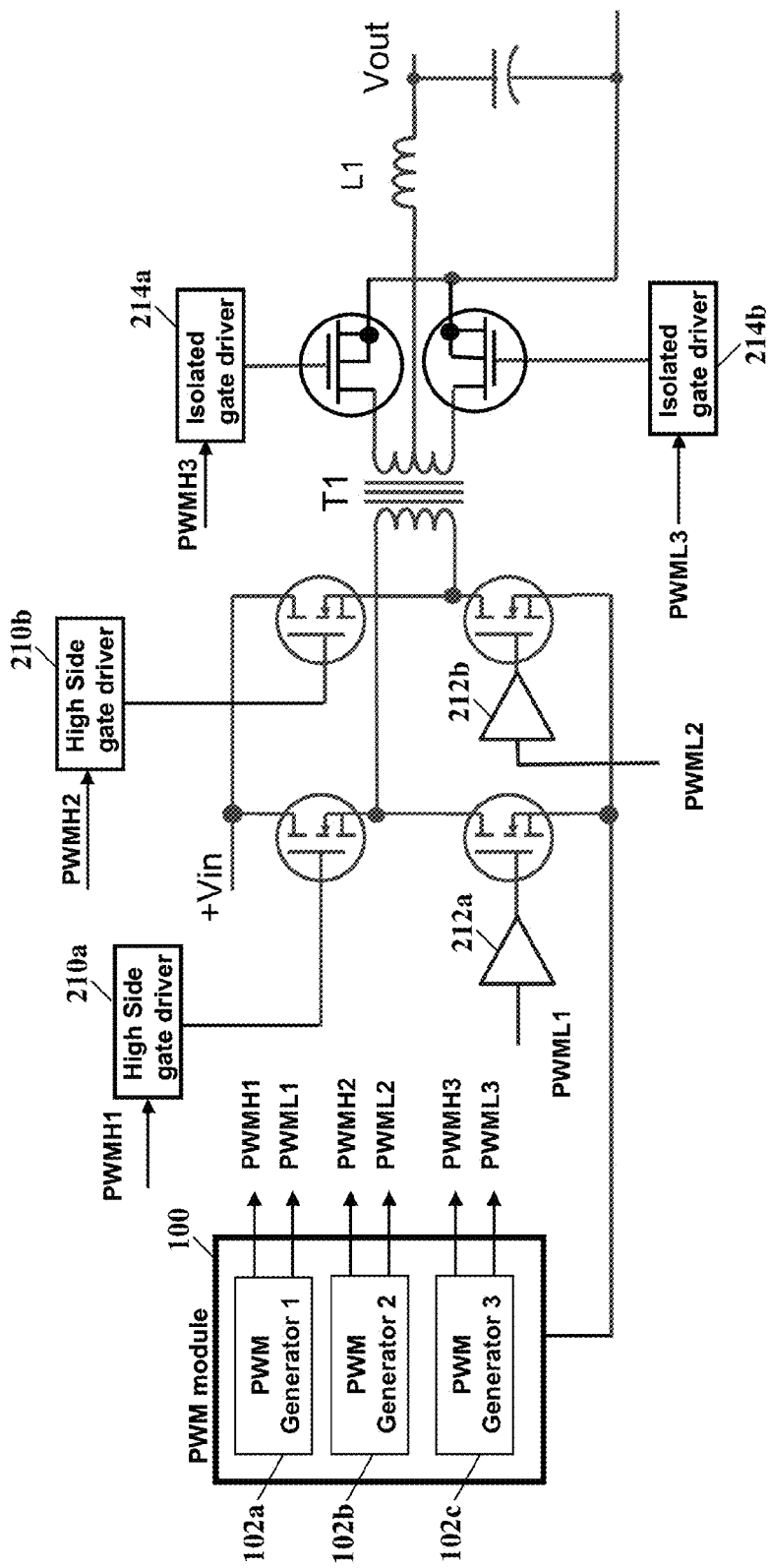
FIG. 2 illustrates a schematic block diagram of a pulse width modulation (PWM) generator having a plurality of complementary high and low PWM signals and a plurality of switching power transistors showing more realistic control signal timing, and the driver and isolation circuits that introduce PWM control signal timing delays.

Referring to FIG. 2, depicted is a schematic block diagram of a pulse width modulation (PWM) generator having a plurality of complementary high and low PWM signals and a plurality of switching power transistors showing more realistic control signal timing, and the driver and isolation circuits that introduce PWM control signal timing delays. Unlike the ideal circuit layout shown in FIG. 1, high side gate drivers 210, inverters 212 and isolated gate drivers 214 are necessary for proper operation of the power transistors and will introduce propagation time delays of various times.

Figure 3:
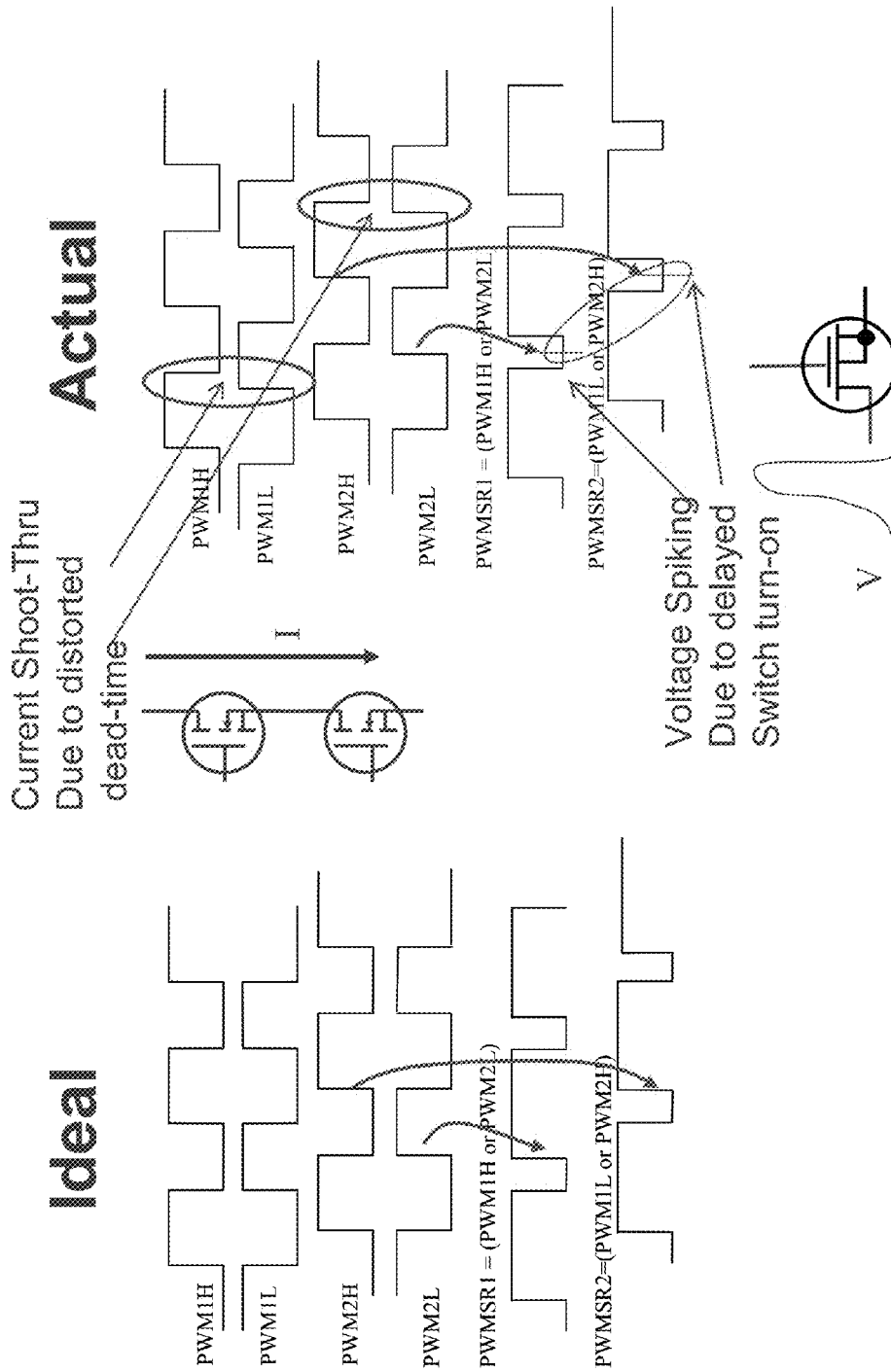
FIG. 3 illustrates schematic waveform timing diagrams for ideal PWM control signal timing and a more realistic typical PWM control signal timing.

Referring to FIG. 3, depicted are schematic waveform timing diagrams for ideal PWM control signal timing and a more realistic typical PWM control signal timing. For the ideal circuit layout of FIG. 1 and logic level transitions of related PWM control signal pairs (PWMxH and PWMxL) occur at substantially the same time thereby preventing both of the high and low power transistors to on or off at the same time. However in a actual circuit layout shown in FIG. 2 the time delay skew of the logic level transitions of the related PWM control signal pairs (PWMxH and PWMxL) may occur at different times, thereby causing current shoot-through (both high and low power transistors on at the same time) or voltage spiking caused by delayed turn-on of a power transistor (both high and low power transistors off at the same time). Neither of these conditions is desirable in a switch mode power conversion application.

Figure 4:
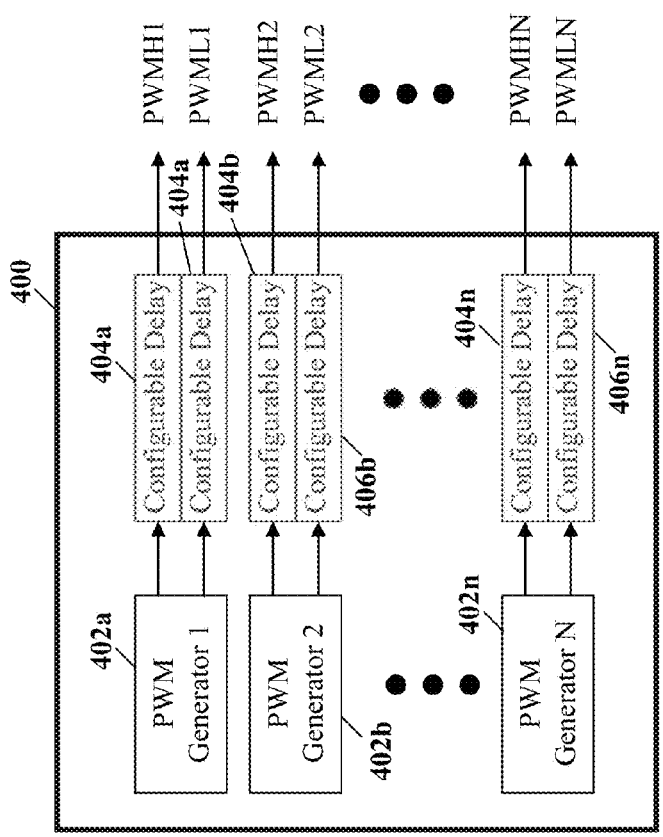
FIG. 4 illustrates a schematic block diagram of a PWM generator having a plurality of PWM generators and configurable time delay circuits, according to specific example embodiments of this disclosure.

Referring to FIG. 4, depicted is a schematic block diagram of a PWM generator having a plurality of PWM generators and configurable time delay circuits, according to specific example embodiments of this disclosure. A digital device, e.g., a microcontroller, generally represented by the numeral 400, may comprise a plurality of PWM generators 402, a plurality of high configurable time delay circuits 404, and a plurality of low configurable time delay circuits 406. Each of the plurality of high and low configurable time delay circuits 404 and 406 may be set to a time delay determined by the time delays required for each of the PWMHx and PWMLx control signals reaching their associated power transistors at substantially the same time.

Figure 5:
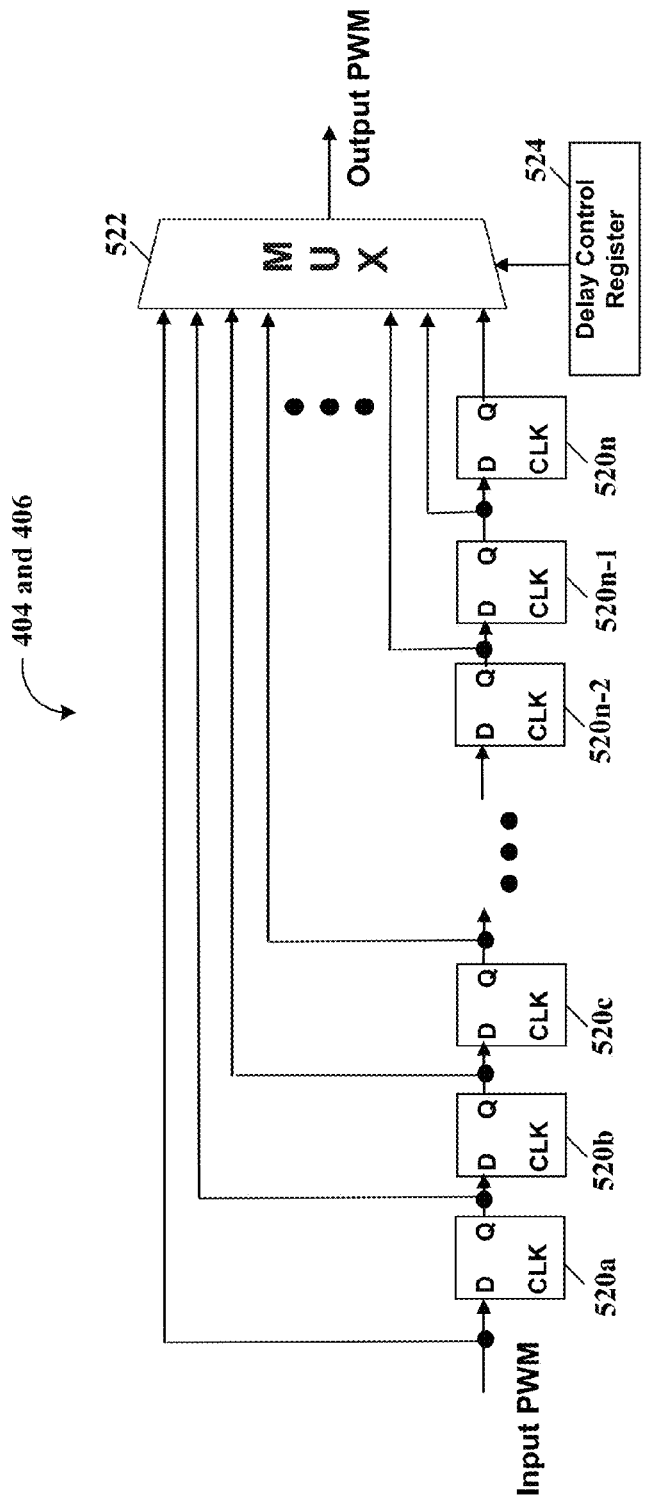
FIG. 5 illustrates a schematic block diagram of a plurality of shift registers and a multiplexer used to provide a time delay for a single configurable time delay circuit as shown in FIG. 4, according to a specific example embodiment of this disclosure.

Referring to FIG. 5, depicted is a schematic block diagram of a plurality of shift registers and a multiplexer used to provide a time delay for a single configurable time delay circuit as shown in FIG. 4, according to a specific example embodiment of this disclosure. The configurable time delay circuit 404 and 406 may comprise a plurality of shift registers 520, a multiplexer 522 and delay control register 524. Each of the shift registers introduces a time delay to the input PWM signal. The multiplexer 522 is used to select an output of a specific shift register 520 corresponding to the total time delay (sum of the time delays from the input PWM signal to the output of the selected shift register 520) required by the associated PWM control signal. The delay control register 524 may be used to store an input number of the multiplexer 522 corresponding to the time delay required and to control the multiplexer 522 to coupled that input to the output thereof (output PWM).

Figure 6:
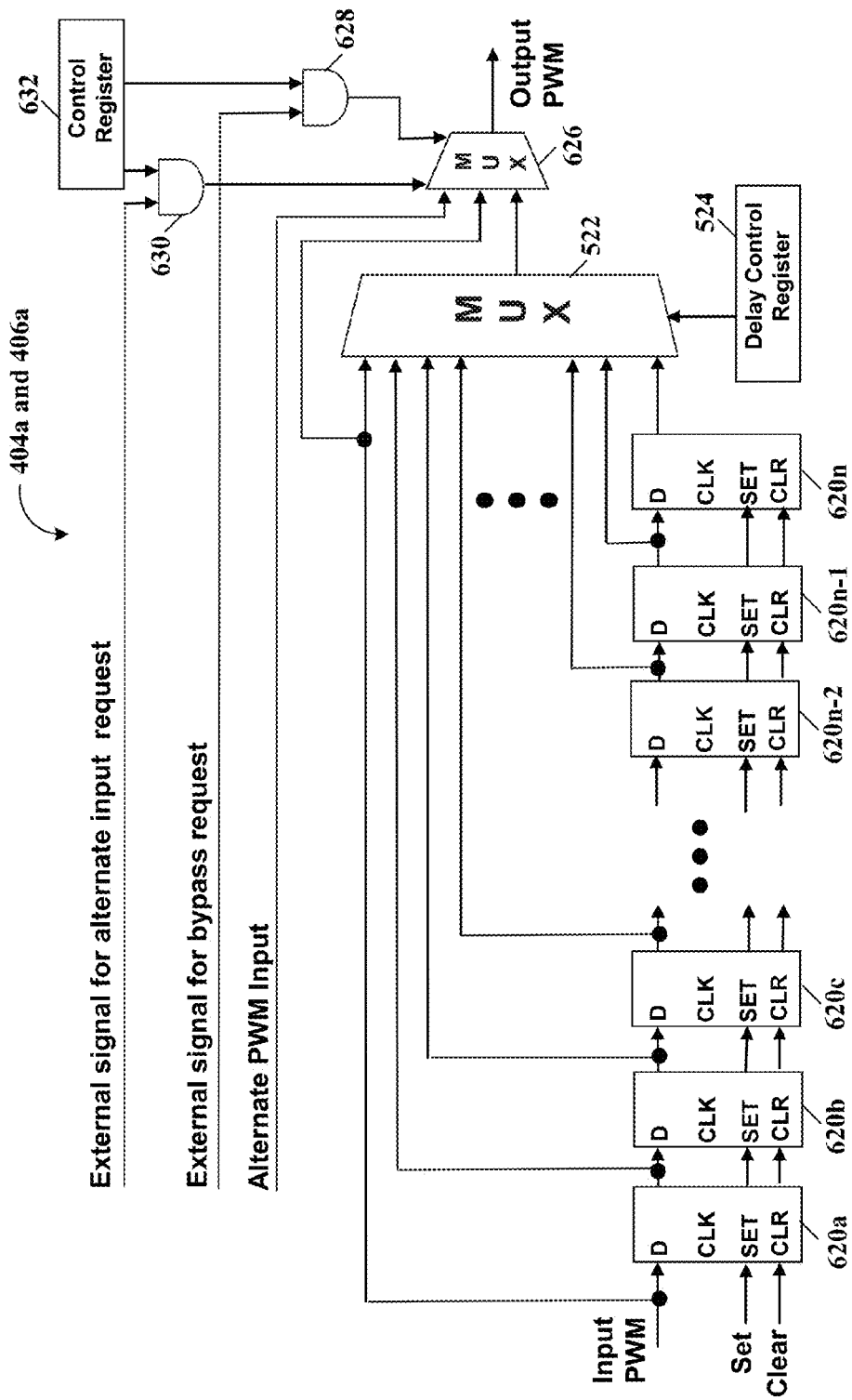
FIG. 6 illustrates a schematic block diagram of a plurality of shift registers and a multiplexer used to provide a time delay for a single configurable time delay circuit, as shown in FIG. 4, that further has initialization, bypass and alternate input PWM signal controls, according to another specific example embodiment of this disclosure.

Referring to FIG. 6, depicted is a schematic block diagram of a plurality of shift registers and a multiplexer used to provide a time delay for a single configurable time delay circuit, as shown in FIG. 4, that further has initialization, bypass and alternate input PWM signal controls, according to another specific example embodiment of this disclosure. The configurable time delay circuit 404a and 406a may comprise a plurality of shift registers 630, multiplexer 522 and delay control register 524 that work in substantially the same way as the corresponding elements show in FIG. 5 and described hereinabove. Additional features may be provided for delay element initialization, delay bypass and delay swap as more fully described hereinafter.

The delay elements (shift registers 620) are set or cleared as specified by the user following, for example but not limited to, a system reset or an asynchronous external event. This feature may be used for device and application initialization. The delay bypass feature may be used to bypass the delay elements (shift registers 620) so that an input PWM signal may propagate as fast as possible to the output PWM. The delay bypass feature is provided when the input of the multiplexer 626 that is coupled to the input PWM signal is connected to the output thereof. Input selection of the multiplexer 626 may be controlled through NAND gates 628 and 630. This feature may be used to respond immediately to situations in the application circuit such as for example but not limited to current limiting or fault conditions. The delay swap feature may be used to allow swapping of the normal PWM input to an alternate PWM input that may be from a different delay circuit and may be used in response to external events in an application circuit.

It is contemplated and with the scope of this disclosure that a microcontroller may provide the shift registers, multiplexers, registers and logic circuits shown as in FIGS. 5 and 6.

Figure 7:
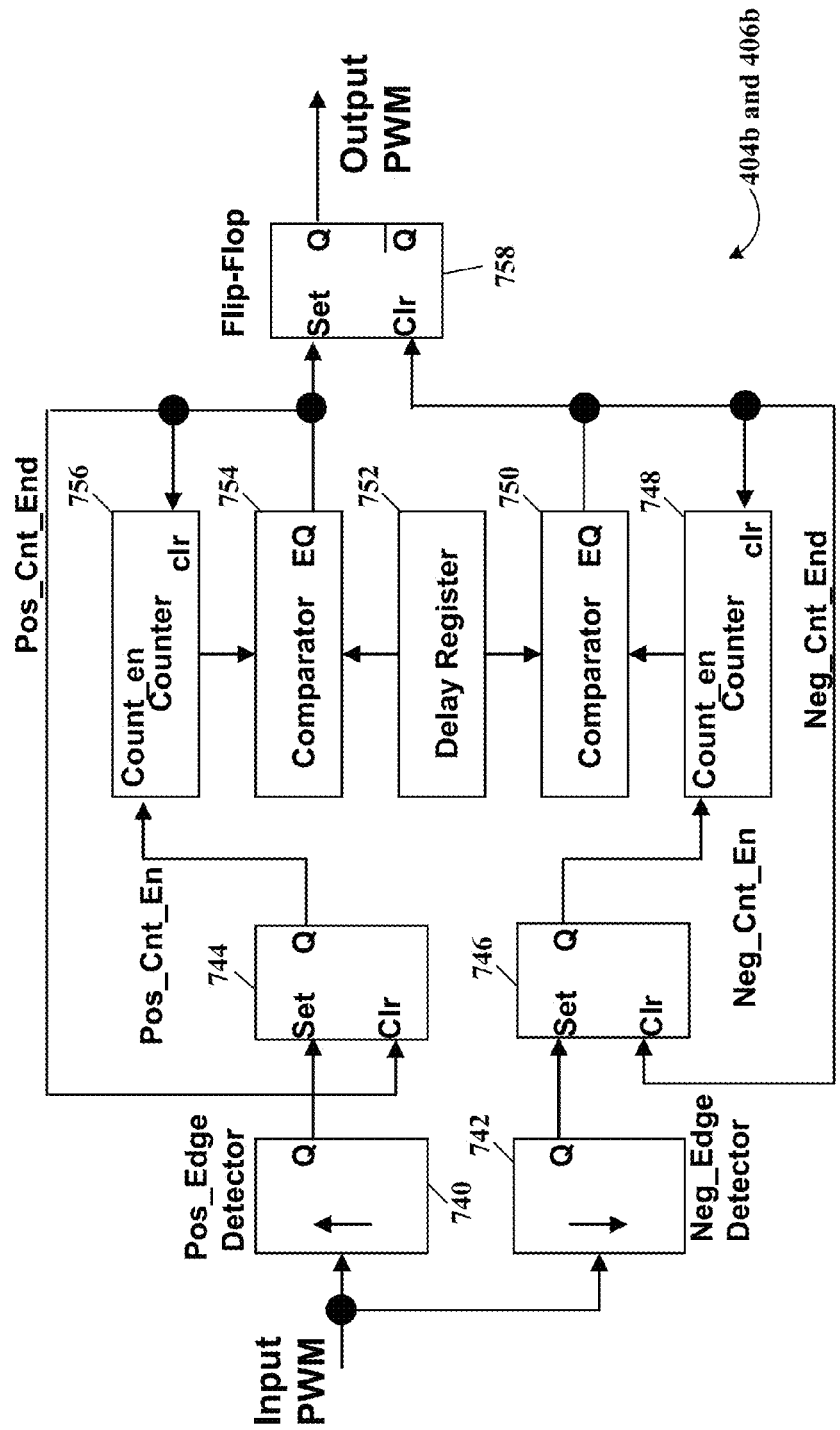
FIG. 7 illustrates a schematic block diagram of a plurality of counters and comparators used to provide a time delay for a single configurable time delay circuit as shown in FIG. 4, according to yet another specific example embodiment of this disclosure.

Referring to FIG. 7, depicted is a schematic block diagram of a plurality of counters and comparators used to provide a time delay for a single configurable time delay circuit as shown in FIG. 4, according to yet another specific example embodiment of this disclosure. The configurable delay circuit 404b and 406b may comprise: a positive edge detector 740 that detects when the input PWM signal goes from a logic low to a logic high. A negative edge detector 742 that detects when the input PWM signal goes from a logic high to a logic low. A logic high counter enable flip-flop 744 having a set input coupled to the output of the positive edge detector 740. A logic low counter enable flip-flop 746 having a set input coupled to the output of the negative edge detector 742. A logic high counter 756 having a count enable input coupled to a Q-output of the logic high counter enable flip-flop 744. A logic low counter 748 having a count enable input coupled to a Q-output of the logic low counter enable flip-flop 746. A delay register 752 storing time delay value used in determining the amount of time delay applied to the input PWM signal. A logic high comparator 754 having first inputs coupled to the outputs of the logic high counter 756, second inputs coupled to outputs of the delay register 752, and an output coupled to clear inputs of the logic high counter 756 and the logic high counter enable flip-flop 744. A logic low comparator 750 having first inputs coupled to the outputs of the logic low counter 748, second inputs coupled to outputs of the delay register 752, and an output coupled to clear inputs of the logic low counter 748 and the logic low counter enable flip-flop 746. And an output flip-flop 758 having a set input coupled to the output of the logic high comparator 754, a clear input coupled to the output of the logic low comparator 750, and a Q-output for providing the delayed output PWM signal.

Figure 8:
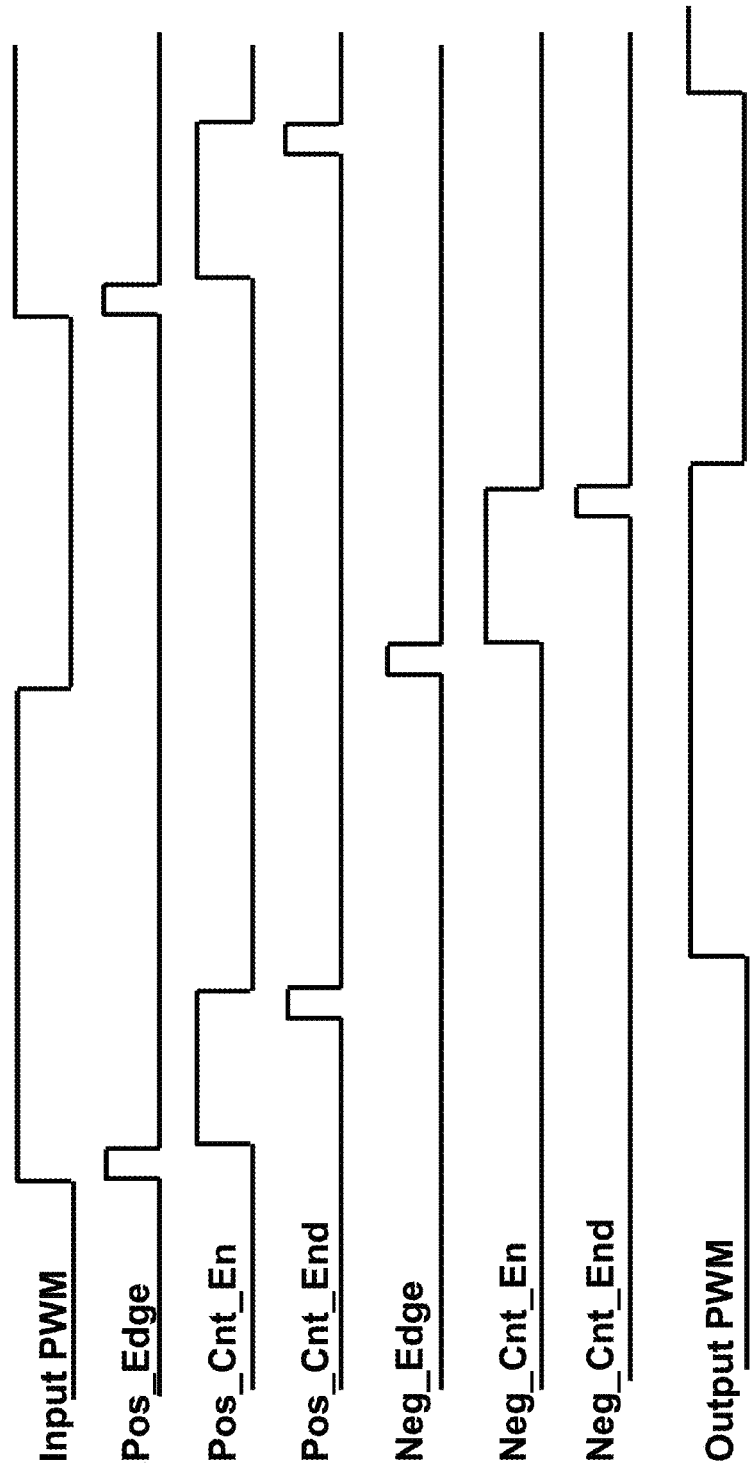
FIG. 8 illustrates schematic waveform timing diagrams for the single configurable time delay circuit shown in FIG. 7.

Referring to FIG. 8, depicted are schematic waveform timing diagrams for the single configurable time delay circuit shown in FIG. 7. When a positive edge (logic low to logic high) on the input PWM signal is detected by the positive edge detector 740, a positive edge pulse (Pos_Edge) is asserted on the set input of the logic high counter enable flip-flop 744. Whereby the Q-output thereof (Pos_Cnt_En) asserts a logic high to the count enable input of the logic high counter 756 which thereafter begins counting up until the count therein is equal to the value (delay time) in the delay register 752. Wherein the equal (EQ) output of the logic high comparator 754 asserts a Pos_Cnt_End logic high to the set input of the output flip-flop 758 and the clear input of the logic high counter enable flip-flop 744. Once the Pos_Cnt_End logic high is asserted the Q-output of the output flip-flop 758 goes to a logic high thereby generating a time delayed output PWM signal at a logic high. The time delayed output PWM signal stays at the logic high until a logic high is asserted on the clear input of the output flip-flop 758.

When a negative edge (logic high to logic low) on the input PWM signal is detected by the negative edge detector 742, a negative edge pulse (Neg_Edge) is asserted on the set input of the logic low counter enable flip-flop 746. Whereby the Q-output thereof (Neg_Cnt_En) asserts a logic high to the count enable input of the logic low counter 748 which thereafter begins counting up until the count therein is equal to the value (delay time) in the delay register 752. Wherein the equal (EQ) output of the logic low comparator 750 asserts a Neg_Cnt_End logic high to the clear input of the output flip-flop 758 and the clear input of the logic low counter enable flip-flop 746. Once the Neg_Cnt_End logic high is asserted the Q-output of the output flip-flop 758 goes to a logic low thereby ending the time delayed output PWM signal to a logic low. The time delayed output PWM signal stays at the logic low until a logic high is again asserted on the set input of the output flip-flop 758. This PWM signal delay cycle continues to repeat as described hereinabove, wherein only one positive and one negative transition of the input PWM signal occurs per PWM period (cycle), and the specified delay time value is less than the PWM signal period.

It is contemplated and with the scope of this disclosure that a microcontroller may provide the edge detectors, flip-flops, comparators and delay register as shown in FIGS. 5 and 6.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for equalizing time delays in a pulse width modulation (PWM) system, said method comprising the steps of:
   determining a maximum propagation delay of a one of a plurality of PWM signals;
   determining propagation delays of other ones of the plurality of PWM signals;
   subtracting each of the propagation delays of the other ones of the plurality of PWM signals from the maximum propagation delay; and
   adding a time delay to each of the other ones of the plurality of PWM signals that is substantially equal to a difference between the maximum propagation delay and the propagation delay of the respective other one of the plurality of PWM signals.

2. The method according to claim 1, further comprising the step of bypassing the time delays to the other ones of the plurality of PWM signals.

3. The method according to claim 1, further comprising the step of bypassing the time delays to the other ones of the plurality of PWM signals when a current limit condition occurs.

4. The method according to claim 1, further comprising the step of bypassing the time delays to the other ones of the plurality of PWM signals when a fault condition occurs.

5. The method according to claim 1, further comprising the step of changing time delays of the other ones of the plurality of PWM signals based upon external events.

6. A pulse width modulation (PWM) system, said system comprising:
   a plurality of pulse width modulation (PWM) generators for generating a plurality of PWM signals; and
   a plurality of configurable time delay circuits coupled between the plurality of PWM generators and associated switching power transistors;
   wherein a one of the plurality of PWM signals has a longest propagation delay to the associated switching power transistor and the associated configurable time delay circuit has substantially no time delay, and wherein the plurality of configurable time delay circuits associated with other ones of plurality of PWM signals have time delays sufficient in combination with associated time delays of the other ones of the plurality of PWM signals to substantially match the longest propagation delay.

7. The PWM system according to claim 6, wherein each of the plurality of configurable time delay circuits comprises:
   a plurality of shift registers coupled in cascade to provide for a plurality of time delays of the signal passing therethrough; and
   a first multiplexer having a plurality of inputs and an output, each one of the plurality of inputs is coupled to an associated output of the plurality of shift registers;
   wherein a one of the plurality of inputs of the first multiplexer is selected for the time delay desired.

8. The PWM system according to claim 7, further comprising a delay control register coupled to the first multiplexer and storing a control value for selection of the one of the plurality of inputs of the first multiplexer.

9. The PWM system according to claim 7, further comprising:
   a second multiplexer having a first input coupled to an output of the first multiplexer, a second input coupled to an associated PWM signal and a third input coupled to an alternate PWM signal; and
   logic circuits coupled to and controlling the second multiplexer for selecting one of the inputs of the second multiplexer to be coupled to an output thereof.

10. The PWM system according to claim 7, further comprising an input control register coupled to the second multiplexer and storing a control value for selection of one of the inputs of the second multiplexer to be coupled to the output thereof.

11. The PWM system according to claim 7, wherein the plurality of shift registers and first multiplexer are provided in a microcontroller.

12. The PWM system according to claim 6, wherein each of the plurality of configurable time delay circuits comprises:
   a positive edge detector having an input coupled to the PWM signal from the associated PWM generator;
   a negative edge detector having an input coupled to the PWM signal from the associated PWM generator;
   a logic high counter enable flip-flop having a set input coupled to an output of the positive edge detector;
   a logic low counter enable flip-flop having a set input coupled to an output of the negative edge detector;

a logic high counter having a count enable input coupled to a Q-output of the logic high counter enable flip-flop;

a logic low counter having a count enable input coupled to a Q-output of the logic low counter enable flip-flop;

a delay register having a delay time value stored therein;

a logic high comparator having first inputs coupled to outputs of the logic high counter and second inputs coupled to outputs of the delay register;

a logic low comparator having first inputs coupled to outputs of the logic low counter and second inputs coupled to outputs of the delay register; and an output flip-flop having a set input coupled to an output from the logic high comparator, a clear input coupled to an output from the logic low comparator, and an output providing a delayed PWM signal;

wherein when a count from the logic high counter is equal to the delay time value the output from the logic high comparator sets a Q-output of the output flip-flop to a high logic level, and when a count from the logic low counter is equal to the delay time value the output from the logic low comparator resets the Q-output of the output flip-flop to a low logic level.

13. The PWM system according to claim 12, wherein the edge detectors, counters, flip-flops, comparators and delay register are provided in a microcontroller.

14. A time delay apparatus for delaying a pulse width modulation (PWM) signal, comprising:

a positive edge detector having an input coupled to a PWM signal;

a negative edge detector having an input coupled to the PWM signal;

a logic high counter enable flip-flop having a set input coupled to an output of the positive edge detector;

a logic low counter enable flip-flop having a set input coupled to an output of the negative edge detector;

a logic high counter having a count enable input coupled to a Q-output of the logic high counter enable flip-flop;

a logic low counter having a count enable input coupled to a Q-output of the logic low counter enable flip-flop;

a delay register having a delay time value stored therein;

a logic high comparator having first inputs coupled to outputs of the logic high counter and second inputs coupled to outputs of the delay register;

a logic low comparator having first inputs coupled to outputs of the logic low counter and second inputs coupled to outputs of the delay register; and an output flip-flop having a set input coupled to an output from the logic high comparator, a clear input coupled to an output from the logic low comparator, and an output providing a delayed PWM signal;

wherein when a count from the logic high counter is equal to the delay time value the output from the logic high comparator sets a Q-output of the output flip-flop to a high logic level, and when a count from the logic low counter is equal to the delay time value the output from the logic low comparator resets the Q-output of the output flip-flop to a low logic level.

15. The time delay apparatus according to claim 14, wherein the positive and negative edge detectors, the logic high and logic low counter enable flip-flops, the logic high and logic low counters, the delay register, the logic high and logic low comparators, and the output flip-flop are provided in a microcontroller.

* * * * *